United States Patent
Eggermont (10) Patent No.: US 10,056,835 B2
(45) Date of Patent: Aug. 21, 2018

(54) CURRENT SENSE ELEMENT FOR CURRENT REGULATED CIRCUIT AND THE LIKE AND METHOD THEREFOR

(71) Applicant: SEMICONDUCTOR COMPONENTS INDUSTRIES, LLC, Phoenix, AZ (US)

(72) Inventor: Jean-Paul Eggermont, Pellaines (BE)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 1 day.

(21) Appl. No.: 15/297,324

(22) Filed: Oct. 19, 2016

(65) Prior Publication Data

US 2018/0109187 A1    Apr. 19, 2018

(51) Int. Cl.
| | | |
|---|---|---|
| G05F 1/573 | (2006.01) |
| H02M 3/158 | (2006.01) |
| H02M 1/08 | (2006.01) |
| G01R 31/34 | (2006.01) |
| G01R 19/08 | (2006.01) |
| H02M 3/156 | (2006.01) |
| H02M 1/00 | (2006.01) |

(52) U.S. Cl.
CPC ............ *H02M 3/158* (2013.01); *G01R 19/08* (2013.01); *G01R 31/34* (2013.01); *H02M 1/08* (2013.01); *H02M 2001/0009* (2013.01)

(58) Field of Classification Search
CPC . H02M 3/156; H02M 2001/0009; G05F 1/10; G05F 1/46; G05F 1/461; G05F 1/56; G05F 1/565; G05F 1/573
See application file for complete search history.

(56) References Cited

U.S. PATENT DOCUMENTS

| 7,023,682 B2 | 4/2006 | Dovheim |
| 7,180,278 B2 * | 2/2007 | Tai ...................... H02M 3/1588 |
| | | 323/277 |
| 7,633,317 B2 | 12/2009 | Miranda et al. |
| 8,232,784 B2 | 7/2012 | Popescu et al. |

(Continued)

OTHER PUBLICATIONS

INA111, High Speed FET-Input, Instrumentation Amplifier. Tucson: Burr-Brown Corporation, Mar. 1998. Pdf.

(Continued)

*Primary Examiner* — Gary L Laxton (74) *Attorney, Agent, or Firm* — Polansky & Associates, P.L.L.C.; Paul J. Polansky (57) ABSTRACT

In one form, a circuit having a current sense element includes a current sense element, a target signal generator, and an error signal generator. The current sense element has first and second terminals and is adapted to be coupled in a current path whose current is to be sensed. The target signal generator generates a target signal representative of a condition of the current sense element when the current sense element conducts a target current. The error signal generator has an output for providing an error signal in response to both a current flowing through the current sense element and the target signal. In another form, a current regulated circuit includes a current conducting element such as a solenoid and a current control element coupled in series with the current conducting element and the current sense element.

20 Claims, 7 Drawing Sheets

(56) References Cited

U.S. PATENT DOCUMENTS

| | | | |
|---|---|---|---|
| 8,681,468 B2 | 3/2014 | Jacob et al. | |
| 2010/0085025 A1* | 4/2010 | Kato | H02M 3/157 323/282 |
| 2016/0344290 A1* | 11/2016 | Yang | H02M 3/1588 |

OTHER PUBLICATIONS

MAX4173, Low-Cost, SOT23, Voltage-Output,High-Side Current-Sense Amplifier. San Jose: Maxim Integrated, Apr. 2011.19-1434; Rev 5. Pdf.

MAX9918/MAX9919/MAX9920, -20V to +75V Input Range, Uni--/Bidirectional, Current-Sense Amplifiers. San Jose: Maxim Integrated, Jan. 2015.19-5015; Rev 6; Pdf.

\* cited by examiner

CURRENT SENSE ELEMENT FOR CURRENT REGULATED CIRCUIT AND THE LIKE AND METHOD THEREFOR

FIELD OF THE DISCLOSURE

The present application relates generally to electrical sensors, and more particularly, to current sense elements and current regulated circuits using current sense elements.

BACKGROUND

Various electromechanical systems use solenoids to switch or actuate high current circuits. For example in automobiles, a transmission system uses a shifting handle to mechanically activate a solenoid to engage a set of gears. In another example, an ignition key or button uses a solenoid to engage a starter motor. In yet another example, an anti-lock braking system (ABS) electronically engages automobile brakes in a controlled manner to prevent wheel lockup and skidding. The electronic controllers in these systems need to accurately regulate the amount of current through the solenoids. For example a transmission control unit (TCU) for a transmission system may regulate a solenoid current to 1-2 amperes (A) with an accuracy of about 1.5% or less.

Electronic controllers use a current sense element along a feedback loop to regulate to perform accurate current regulation. It is difficult to design current sense elements that are both inexpensive and also achieve the required accuracy. For example a typical current sense element circuit detects current by measuring a voltage across a low-valued resistor connected in series with the solenoid. If the value of the resistor is substantially constant, then the measured voltage is proportional to the current with the required accuracy. However the values of the sensing resistors vary with temperature and over their operating lifetimes. Moreover these variances become worse when the resistor is combined with other components in an inexpensive semiconductor integrated circuit. In addition, the amplifier that is used to measure the voltage is also susceptible to various sources of inaccuracy such as gain accuracy when operating with a large common mode voltage and temperature drift. To overcome these problems, known current sense elements have used various trimming and calibration techniques, but these techniques increase system complexity and cost.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

Figure 1:
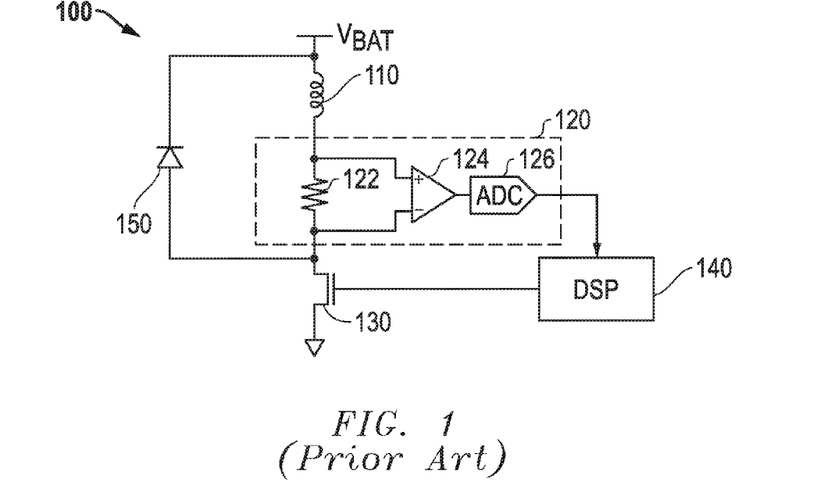
FIG. 1 illustrates in partial block diagram and partial schematic form a current regulated circuit according to the prior art.

FIG. 1 illustrates in partial block diagram and partial schematic form a current regulated circuit 100 according to the prior art. Current regulated circuit 100 includes a solenoid 110, a current sense element 120, a transistor 130, a digital signal processor (DSP) 140, and a diode 150. Solenoid 110 has a first terminal for receiving a power supply voltage labeled "$V_{BAT}$", and a second terminal. $V_{BAT}$ is a power supply voltage from a battery having a nominal voltage of, for example, 12 volts with respect to ground. Current sense element 120 has a first terminal connected to the second terminal of solenoid 110, a second terminal, and an output terminal. Transistor 130 is an N-channel metal-oxide-semiconductor (MOS) transistor having a drain connected to the second terminal of current sense element 120, a gate, and a source connected to ground. DSP 140 has an input connected to the output terminal of current sense element 120, and an output connected to the gate of transistor 130. Diode 150 has an anode connected to the second terminal of current sense element 120, and a cathode connected to the $V_{BAT}$ power supply voltage terminal.

Current sense element 120 includes a resistor 122, an amplifier 124, and an analog-to-digital converter (ADC) 126. Resistor 122 has a first terminal forming the first terminal of current sense element 120, and a second terminal forming the second terminal of current sense element 120. Amplifier 124 has a non-inverting input connected to the first terminal of resistor 122, an inverting terminal connected to the second terminal of resistor 122, and an output. ADC 126 has an input connected to the output of amplifier 124, and an output connected to the input of DSP 140.

Current regulated circuit 100 regulates the current flow through solenoid 110. When activated, current regulated circuit 100 causes current to flow through solenoid 110 at a magnitude that is regulated to a desired amount. Current sense element 120 provides a digital representation of the magnitude of the current through solenoid 110, and DSP 140 digitally regulates it to the desired amount by controlling the on time of transistor 130. Diode 150 provides a clamping path to prevent the voltage at the drain of transistor 130 from rising above $V_{BAT}$ by more than its cutoff voltage, and thus protects transistor 130 from damage due to excessive voltage at its drain when transistor 130 is non-conductive.

Current sense element 120 detects the voltage drop across resistor 122 as a measure of the current flowing through solenoid 110. Amplifier 124 senses and amplifies the voltage difference and provides the voltage difference as a single-ended voltage to ADC 126. ADC 126 converts the voltage to a corresponding digital value, which DSP 140 uses to modulate the conduction of transistor 130 to regulate the current flow to a desired value.

Current sense element 120 has several disadvantages. The current through solenoid 110 is expected to be regulated to a high degree of accuracy, but resistor 122 suffers from drift over temperature and over its lifetime. In addition, the large power dissipation through resistor 122 and transistor 130 cause a large temperature gradient within an integrated circuit die. Since resistor 122 is a floating sensing element, it is difficult to sense the voltage across its terminals. Resistor 122 is also costly due to its required precision.

Figure 2:
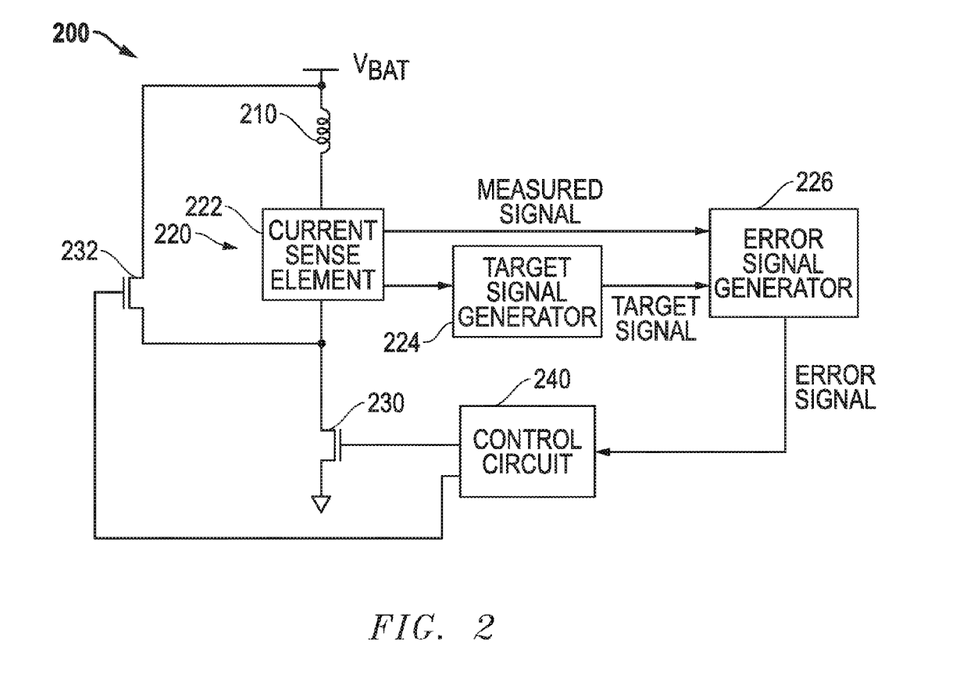
FIG. 2 illustrates in partial block diagram and partial schematic form a current regulated circuit according to an embodiment.

FIG. 2 illustrates in partial block diagram and partial schematic form a current regulated circuit 200 according to an embodiment. Current regulated circuit 200 includes a current conducting element in the form of a solenoid 210, a current sense element 220, a transistor 230, a transistor 232, and a control circuit 240. Solenoid 210 has a first terminal for receiving $V_{BAT}$, and a second terminal. Current sense element 220 has a first terminal connected to the second terminal of solenoid 210, a second terminal, and an output terminal for providing a signal labeled "ERROR SIGNAL". Transistor 230 is an N-channel MOS transistor having a drain connected to the second terminal of current sense element 220, a gate, and a source connected to ground. Transistor 232 is a P-channel MOS transistor having a source connected to the VBAT terminal, a gate, and a drain connected to the second terminal of solenoid 210. Control circuit 240 has an input connected to the output terminal of current sense element 220 for receiving the ERROR SIGNAL, and an output connected to the gate of transistor 230. Diode 250 has an anode connected to the second terminal of current sense element 220, and a cathode connected to the $V_{BAT}$ power supply voltage terminal.

Current sense element 220 includes a current sense element 222, a target signal generator 224, and an error signal generator 226. Current sense element 222 has a first terminal forming the first terminal of current sense element 220, a second terminal forming the second terminal of current sense element 220, a first output for providing a signal labeled "MEASURED SIGNAL", and a second output. Target signal generator 224 has an input connected to the second output of current sense element 222, and an output for providing a signal labeled "TARGET SIGNAL". Error signal generator 226 has a first input connected to the first output of current sense element 222 for receiving the MEASURED SIGNAL, a second input connected to the output of target signal generator 224 for receiving the TARGET signal, and an output connected to the input of control circuit 240 for providing the ERROR SIGNAL.

In operation, current sense element 222 is connected in a current path whose current is to be sensed, such as a solenoid current control circuit as in current regulated circuit 200. It provides two outputs representative of the current flowing through it. Target signal generator 224 generates the TARGET SIGNAL as a signal representative of a condition of current sense element 222 when current sense element 222 conducts a target current. Error signal generator 226 has an output for providing the ERROR SIGNAL as the difference between the current actually flowing through current sense element 222, i.e. the MEASURED SIGNAL, and the TARGET SIGNAL.

As will be described more fully below, current sense element 222 can be, for example, a resistor or the drain sense element of a sense transistor. Target signal generator 224 generates the TARGET SIGNAL to represent a condition of current sensing element 222 when current sensing element 222 conducts a target current. In one example, target signal generator 224 generates the TARGET SIGNAL as a voltage drop across current sense element 222 when current sense element 222 conducts the target current, and thus the input is connected to the second output of current sense element 222 to adjust its output based on, for example, the voltage on the second terminal of current sense element 222. In another example, target signal generator 224 generates the TARGET SIGNAL as the current passing through current sense element 222 when current sense element 222 generates the target current.

Thus target signal generator 224 outputs the TARGET SIGNAL as a target or reference to which the actual value can be compared. To generate a useful value, target signal generator 224 does not need to provide the TARGET SIGNAL with high absolute accuracy as long as the component it uses matches current sense element 222.

Error signal generator 226 provides the ERROR SIGNAL in response to the difference between the MEASURED SIGNAL and the TARGET SIGNAL. Control circuit 240 modulates the on time of transistor 230 to reduce the magnitude of the ERROR SIGNAL. Thus current regulated circuit 200 controls transistor 230 in order to null the ERROR SIGNAL, or stated another way, to make the MEASURED SIGNAL equal to the TARGET SIGNAL.

Current sense element 220 provides various advantages over known current sense element designs and over the current regulated circuits that use them. First, by subtracting the TARGET SIGNAL from the MEASURED SIGNAL and regulating the loop based on the ERROR SIGNAL, current regulated circuit 200 avoids the need for high precision, costly components such as high precision resistors. The only need is for the component (such as a resistor) in target signal generator 224 to be matched to the component used in current sense element 222. Thus cheaper and possibly integrated components can be used. Second, current regulated circuit 200 does not experience significant temperature and lifetime sensitivity. Because they are matched, current sense element 222 and target signal generator 224 may drift over temperature and over their lifetimes, but their drifts will tend to match and therefore cancel each other out. Third, by generating the ERROR SIGNAL as the difference between the MEASURED SIGNAL and the TARGET SIGNAL, current sense element 220 avoids problems caused by the floating reference. Note that target signal generator 224 uses an output of current sense element 222 so that it is referenced to the same floating node.

There are a variety of circuits that can be used to implement the components of current regulated circuit 200. These various circuits will be explained first with reference to specific examples of current regulated circuits, as well as specific components on an element by element basis.

Figure 3:
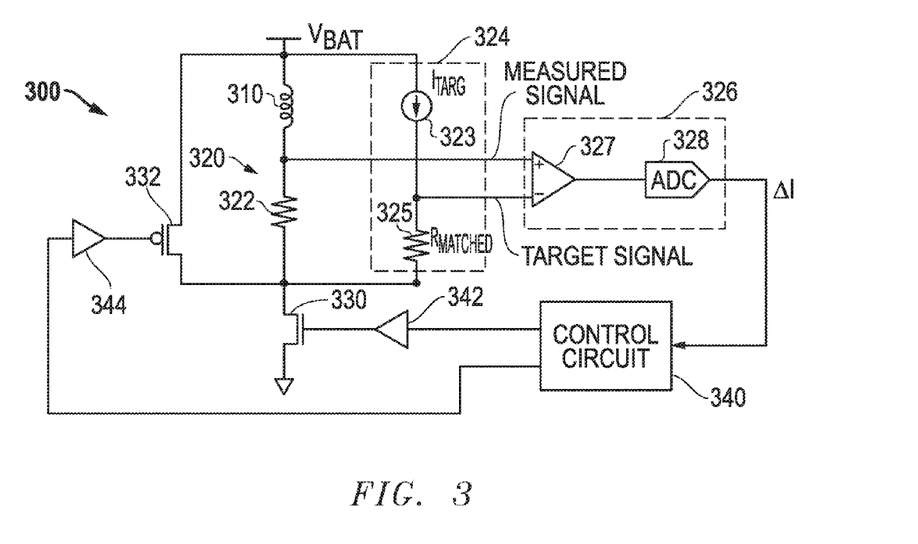
FIG. 3 illustrates in partial block diagram and partial schematic form a current regulated circuit according to an embodiment of the current regulated circuit of FIG. 2.

FIG. 3 illustrates in partial block diagram and partial schematic form a current regulated circuit 300 according to an embodiment of current regulated circuit 200 of FIG. 2. Current regulated circuit 300 includes generally a current conducting element in the form of a solenoid 310, a current sense element 320, transistors 330 and 332, a control circuit 340, and buffers 342 and 344. Solenoid 310 has a first terminal for receiving $V_{BAT}$, and a second terminal. Current sense element 320 has a first terminal connected to the second terminal of solenoid 310, a second terminal, and an output terminal for providing an error signal in the form of a difference current labeled "ΔI". Transistor 330 is an N-channel MOS transistor having a drain connected to the second terminal of current sense element 320, a gate, and a source connected to ground. Transistor 332 is an P-channel MOS transistor having a source connected to the $V_{BAT}$ terminal, a gate, and a drain connected to the second terminal of current sense element 320. Control circuit 340 has an input connected to the output terminal of current sense element 320 for receiving error signal ΔI, a first output connected to the gate of transistor 330, and a second output connected to the gate of transistor 332. Buffer 342 has an input connected to the first output of control circuit 340, and a second output connected to the gate of transistor 330. Buffer 344 has an input connected to the second output of control circuit 340, and a second output connected to the gate of transistor 332.

Current sense element 320 includes a resistor 322, a target signal generator 324, and an error signal generator 326. Resistor 322 has a first terminal forming the first terminal of current sense element 320, and a second terminal forming the second terminal of current sense element 320, in which the first terminal also forms a the MEASURED SIGNAL.

Target signal generator 324 has a first terminal connected to the $V_{BAT}$ terminal, a second terminal connected to the second terminal of resistor 322, and an output for providing the TARGET SIGNAL. Target signal generator 324 includes a current source 323 and a resistor 325. Current source 323 has a first terminal connected to the $V_{BAT}$ terminal, and a second terminal for providing the TARGET SIGNAL, and conducts a current labeled "$I_{TARG}$". Resistor 325 has a first terminal connected to the second terminal of current source 323, and a second terminal connected to the second terminal of resistor 322, and has a resistance labeled "$R_{MATCHED}$".

Error signal generator 226 has a first input connected to the first output of current sense element 222 for receiving the MEASURED SIGNAL, a second input connected to the output of target signal generator for receiving the TARGET SIGNAL, and an output connected to the input of control circuit 340 for providing the ERROR SIGNAL. Error signal generator 326 includes an amplifier 327 and an ADC 328. Amplifier 327 includes a non-inverting input for receiving the MEASURED SIGNAL, an inverting input for receiving the TARGET SIGNAL, and an output. ADC 328 has an input connected to the output of amplifier 326, and an output for providing error signal ΔI.

Current regulated circuit 300 implements target signal generator 224 of FIG. 2 by forming the TARGET SIGNAL as a voltage representative of the voltage formed at the first terminal of resistor 322 when solenoid 310 conducts the desired amount of current. Current source 323 sources current $I_{TARG}$ as a current proportional to the desired amount of current. Resistor 325 provides resistance $R_{MATCHED}$ that is inversely proportional to the resistance of resistor 322, in the same proportionality as $I_{TARG}$ is to the target current through solenoid 310. For example if the desired current through solenoid 310 is equal to 1 A and the nominal resistance of resistor 322 is equal to 1 ohm (Ω), then if $I_{TARG}$ is equal to 1 milliampere (mA), then $R_{MATCHED}$ would be set to 1 kilohm (kΩ). When the elements of current sense element 320 are combined in a single integrated circuit, resistor 325 may also be matched to resistor 322 by layout on the integrated circuit. The layout matching can include, for example, the orientation on the integrated circuit such that variations in processing in a certain direction will affect both resistors proportionally.

Since ΔI is a digital value, control circuit 340 can be implemented as a DSP. Control circuit 340 uses buffer 342 to drive the gate of transistor 330 and buffer 344 to drive the gate of transistor 332. Current regulated circuit 300 uses transistor 332 as a synchronous clamp such that it is conductive generally during times when transistor 330 is non-conductive, except that there is a sufficient amount of non-overlap time to avoid shoot through currents.

Thus current sense element 320 uses two resistors to develop a digital error signal ΔI. The resistors need not have highly accurate values as long as they are properly matched, e.g. in both size and layout.

Figure 4:
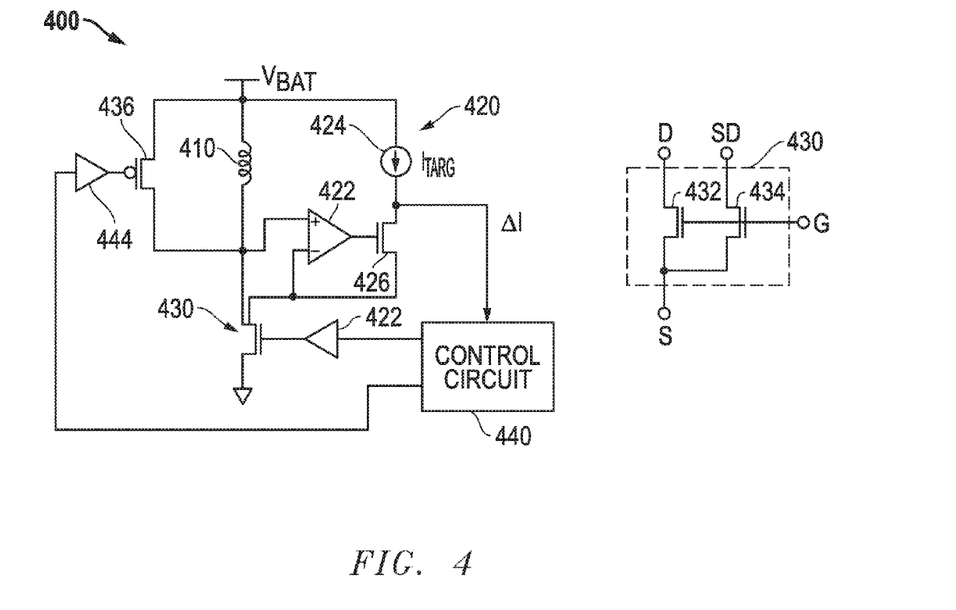
FIG. 4 illustrates in partial block diagram and partial schematic form a current regulated circuit according to another embodiment of the current regulated circuit of FIG. 2.

FIG. 4 illustrates in partial block diagram and partial schematic form a current regulated circuit 400 according to another embodiment of current regulated circuit 200 of FIG. 2. Current regulated circuit 400 includes generally a current conducting element in the form of a solenoid 410, a target and error signal generator 420, a sense transistor 430, a transistor 436, a control circuit 440, and buffers 442 and 444. Solenoid 410 has a first terminal for receiving $V_{BAT}$, and a second terminal. Target and error signal generator 420 includes an amplifier 422, a current source 424, and a transistor 426. Amplifier 422 has a non-inverting input connected to the second terminal of solenoid 410, an inverting input, and an output. Current source 424 has a first terminal connected to the $V_{BAT}$ terminal, and a second terminal, and conducts current $I_{TARG}$. Transistor 426 has a drain connected to the second terminal of current source 424, a gate connected to the output of amplifier 422, and a source connected to the inverting input of amplifier 422.

Sense transistor 430 has a drain connected to the second terminal of solenoid 410 and to the non-inverting input of amplifier 422, a sense drain connected to the inverting input of amplifier 422 and to the source of transistor 426, a gate, and a source connected to ground. Sense transistor 430 is a composite N-channel MOS power transistor having a drain terminal, a sense drain terminal, a gate, and a source. Sense transistor 430 is formed using a current conduction element 432 and a drain sense element 434. Current conduction element 432 has a drain forming the drain terminal (D) of sense transistor 430, a gate connected to the gate terminal (G) of sense transistor 430, and a source connected to the source terminal (S) of sense transistor 430. Drain sense element 434 has a drain forming the sense drain terminal (SD) of sense transistor 430, a gate connected to the gate terminal of sense transistor 430, and a source connected to the source terminal of sense transistor 430. Transistor 436 is a P-channel MOS transistor having a source connected to the $V_{BAT}$ terminal, a gate, and a drain connected to the second terminal of solenoid 410.

Control circuit 440 has an input connected to the second terminal of current source 424, a first output, and a second output. Buffer 442 has an input connected to the first output of control circuit 440, and an output connected to the gate of sense transistor 430. Buffer 444 has an input connected to the second output of control circuit 440, and an output connected to the gate of transistor 432.

Sense transistor 430 implements portions of current sense element 220 and transistor 230 of FIG. 2. Current conduction element 434 operates as both current sense element 222 and transistor 230. Drain sense element 436 operates as part of target signal generator 224. Amplifier 422 and transistor 426 operate as the other portion of current sense element 222. Current source 424 operates as target signal generator 224 providing the TARGET SIGNAL. Current source 424, amplifier 422, and transistor 426 operate as error signal generator 226. Amplifier 422 controls the conductivity of transistor 426 to output the MEASURED SIGNAL. The difference between the MEASURED SIGNAL and the TARGET SIGNAL provides an analog error signal ΔI. Control circuit 440 can be an analog control circuit or, with the addition of an ADC, a digital control circuit such as a DSP.

Current regulated circuit 400 has generally the same benefits as current regulated circuit 300 of FIG. 3, but by the use of sense transistor 430, it has a smaller area and lower power dissipation than current regulated circuit 300. Also while the input offset of amplifier 422 is kept low, there is no need for it to have an accurate gain.

Figure 5:
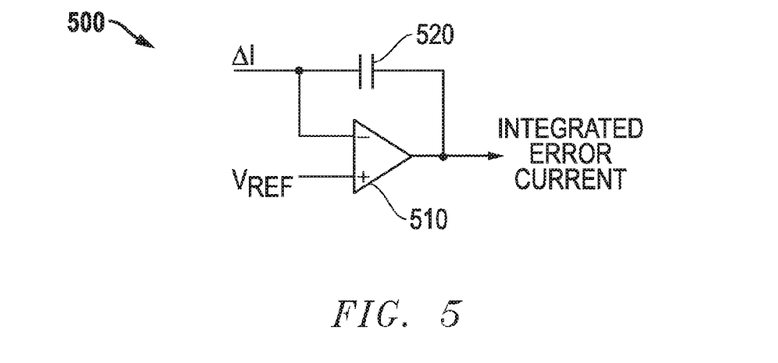
FIG. 5 illustrates in partial block diagram and partial schematic form an integrator suitable for use in a current regulated circuit.

FIG. 5 illustrates in partial block diagram and partial schematic form an integrator 500 suitable for use in a current regulated circuit. Integrator 500 includes an amplifier 510 and a capacitor 520. Amplifier 510 has a non-inverting input for receiving error signal ΔI, an inverting input for receiving a reference voltage labeled "$V_{REF}$", and an output for providing a signal labeled "INTEGRATED ERROR CURRENT". Capacitor 520 has a first terminal connected to the output of amplifier 510, and a second terminal connected to the non-inverting input of amplifier 510. Integrator 500 is useful in smoothing changes in error signal ΔI so that the control loop is stable. Integrator 500 can be used to integrate the error signal over a switching period or over the conduction time, for example the conduction time of sense transistor 430, by inserting the integrator 500 between the error signal generator providing the error signal ΔI and the control circuit 440. It is useful in several current regulated circuits including the one which will now be described.

Figure 6:
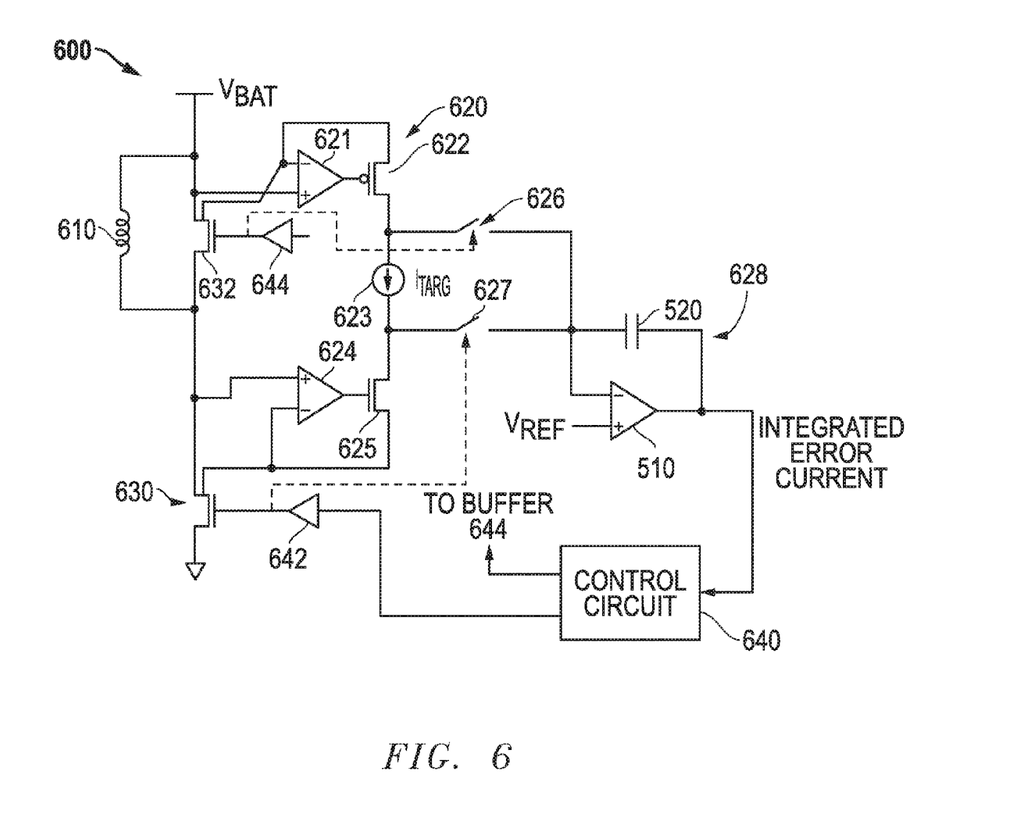
FIG. 6 illustrates in partial block diagram and partial schematic form a current regulated circuit according to yet another embodiment of the current regulated circuit of FIG. 2.

FIG. 6 illustrates in partial block diagram and partial schematic form a current regulated circuit 600 according to yet another embodiment of current regulated circuit 200 of FIG. 2. Current regulated circuit 600 includes generally a current conducting element in the form of a solenoid 610, a target and error signal generator 620, sense transistor 630, transistor 632, a control circuit 640, and buffers 642 and 644. Solenoid 610 has a first terminal for receiving $V_{BAT}$, and a second terminal.

Target and error signal generator 620 includes an amplifier 621, a transistor 622, a current source 623, an amplifier 624, a transistor 625, switches 626 and 627, and an integrator 628. Amplifier 621 has a non-inverting input connected to the $V_{BAT}$ terminal, an inverting input, and an output. Transistor 622 is a P-channel MOS transistor having a source connected to the inverting input of amplifier 621, a gate connected to the output of amplifier 621, and a drain. Current source 623 has a first terminal connected to the drain of transistor 622, and a second terminal, and conducts current $I_{TARG}$. Amplifier 624 has a non-inverting input connected to the second terminal of solenoid 610, an inverting input, and an output. Transistor 625 is a N-channel MOS transistor having a drain connected to the second terminal of current source 623, a gate connected to the output of amplifier 624, and a source connected to the inverting input of amplifier 624. Switch 626 has a first terminal connected to the drain of transistor 622, a second terminal, and a control terminal. Switch 627 has a first terminal connected to the drain of transistor 625, a second terminal connected to the second terminal of switch 626, and a control terminal. Integrator 628 has an input connected to the second terminals of switches 626 and 627, and an output for providing the INTEGRATED ERROR CURRENT.

Sense transistor 630 is a composite N-channel MOS power transistor having a drain connected to the second terminal of solenoid 610 and to the non-inverting input of amplifier 624, a sense drain connected to the inverting input of amplifier 624 and to the source of transistor 625, a gate, and a source connected to ground. Sense transistor 632 is a composite N-channel MOS power transistor having a drain terminal connected to the $V_{BAT}$ node, a sense drain terminal connected to the inverting input of amplifier 621, a gate, and a source connected to the second terminal of solenoid 610.

Control circuit 640 has an input connected to the output of integrator 628, a first output, and a second output. Buffer 642 has an input connected to the first output of control circuit 640, and an output connected to the gate of sense transistor 630 and to the control terminal of switch 627. Buffer 644 has an input connected to the second output of control circuit 640, and an output connected to the gate of transistor 632 and to the control terminal of switch 626.

Current regulated circuit 600 uses a differential architecture to develop the net current through solenoid 610 during on and off times. When current is being conducted through solenoid 610, sense transistor 630 is conductive, sense transistor 632 is non-conductive, buffer 644 opens switch 626, and buffer 642 closes switch 627. Amplifier 621 drives a voltage onto the gate of transistor 622 to make it conductive. When current is being not conducted through solenoid 610, sense transistor 632 is conductive, sense transistor 630 is non-conductive, buffer 644 closes switch 626, and buffer 642 opens switch 627. Amplifier 624 drives a voltage onto the gate of transistor 625 to make it conductive to zero out.

The components of current regulated circuit 200 of FIG. 2 can be implemented in a variety of ways, such as the ways shown in the exemplary embodiments of FIGS. 3, 4, and 6. These and several additional ways will now be described.

Figure 7:
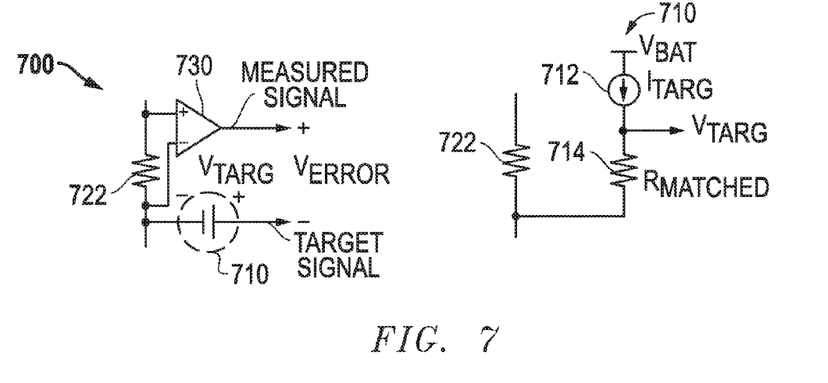
FIG. 7 illustrates in schematic form a portion of a current regulated circuit showing a first form of a target signal generator.

FIG. 7 illustrates in schematic form a portion 700 of a current regulated circuit showing a first form of a target signal generator. Portion 700 includes a resistor 722 operating as a current sense element, a target voltage source 710, and a difference amplifier 730. As in the other embodiments, resistor 722 has first and second terminals connected in a current conduction path of an inductive element in the form of a solenoid whose current is to be regulated to a desired value. Target voltage source 710 has a negative terminal connected to the second terminal of resistor 722, and a positive terminal for providing the TARGET SIGNAL, and provides a voltage labeled "$V_{TARG}$". Difference amplifier 730 has a non-inverting input connected to the first terminal of resistor 722, an inverting input connected to the second terminal of resistor 722, and an output for providing the MEASURED SIGNAL. FIG. 7 shows that an error signal labeled "$V_{ERROR}$" is represented as the difference between the MEASURED SIGNAL and the TARGET SIGNAL. FIG. 7 also shows target voltage source 710 implemented with a current source 712 and a resistor 714. Current source 712 has a first terminal connected to the $V_{BAT}$ terminal, and a second terminal for providing the TARGET SIGNAL, and conducts current $I_{TARG}$. Resistor 714 has a first terminal connected to the second terminal of current source 712, and a second terminal connected to the second terminal of resistor 722, and has resistance $R_{MATCHED}$. The TARGET SIGNAL is equal to $V_{TARG}$ plus the voltage at the second terminal of resistor 722.

Figure 8:
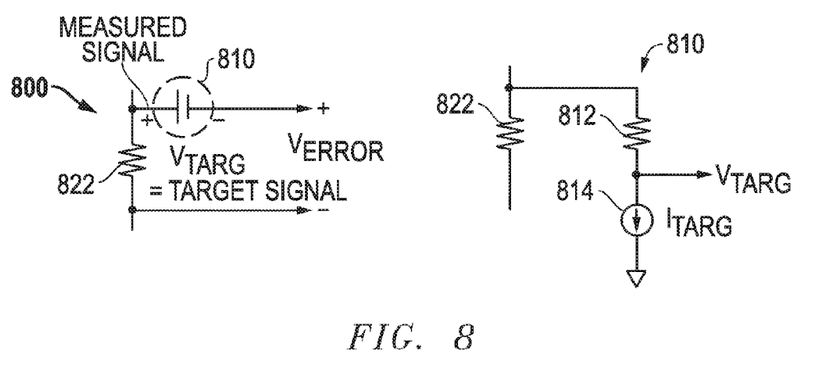
FIG. 8 illustrates in schematic form a portion of a current regulated circuit showing a second form of a target signal generator.

FIG. 8 illustrates in schematic form a portion 800 of a current regulated circuit showing a second form of a target signal generator. Portion 800 includes a resistor 822 operating as a current sense element and a target voltage source 810. Resistor 822 has first and second terminals connected in a current conduction path of an inductive element in the form of a solenoid whose current is to be regulated to a desired value. Target voltage source 810 has a positive terminal connected to the first terminal of resistor 822, and a negative terminal for providing the TARGET SIGNAL, and provides a voltage $V_{TARG}$. FIG. 8 shows that an error signal labeled "$V_{ERROR}$" is represented as the difference between the TARGET SIGNAL added to $V_{TARG}$, and a reference voltage at the second terminal of resistor 822. FIG. 8 also shows target voltage source 810 implemented with a resistor 812 and a current sink 814. Resistor 812 has a first terminal connected to the first terminal of resistor 822, and a second terminal for providing the MEASURED SIGNAL—$V_{TARG}$. Current source 814 has a first terminal connected to the second terminal of resistor 812, and a second terminal connected to ground, and conducts current $I_{TARG}$. In portion 800, $V_{ERROR}$ is again equal to the MEASURED SIGNAL minus the TARGET SIGNAL, but $V_{ERROR}$ is developed differently than the way it is developed in FIG. 7.

Figure 9:
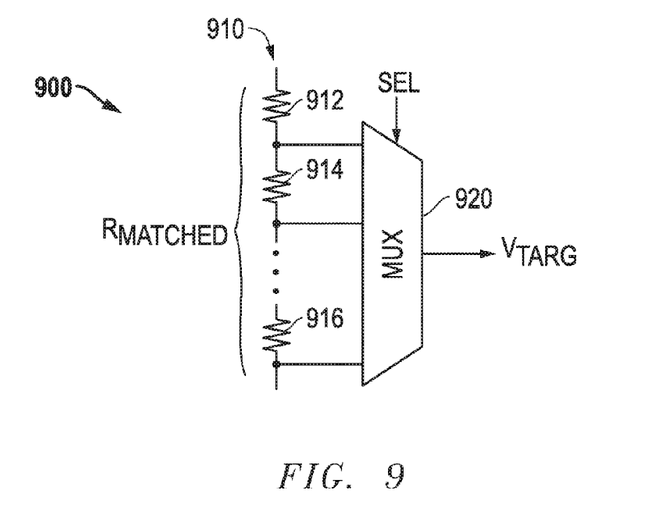
FIG. 9 illustrates in schematic form a segmented resistor suitable for use in the target signal generators of FIGS. 3, 7, and 8.

FIG. 9 illustrates in schematic form a segmented resistor 900 suitable for use in the target signal generators of FIGS. 3, 7, and 8. Segmented resistor 900 includes a resistor ladder 910 and a multiplexer 920. Resistor ladder 910 is formed using a set of resistive segments connected in series. Shown in FIG. 9 is a representative set of resistive segments 912, 914, and 916, in which resistive segment 912 has a first terminal connected to the first terminal of segmented resistor 900, and a second terminal, resistive segment 914 has a first terminal connected to the second terminal of resistive segment 912, and a second terminal, and so on until resistive segment 916 that has a first terminal connected to the second terminal of the immediately preceding resistive segment in the series, and a second terminal connected to the second terminal of segmented resistor 900. Multiplexer 920 has inputs connected to terminals of respective ones of the set of resistors in resistor ladder 910, an output for providing the $V_{TARG}$ signal, and a control terminal for receiving a control signal labeled "SEL".

Segmented resistor 900 allows the resistor to be programmably matched to the sense resistor for a variety of different currents. The value of the resistance is set based on the SEL signal and the selected connection point on the ladder determines the value of the resistance. For example, if segmented resistor 900 is used to implement resistor 714 of FIG. 7 and if the matched value includes all but one resistor segment, then the SEL signal selects the first input thereof, the output of multiplexer 920 forms the first terminal of resistor 714, and the second terminal of resistive segment 916 forms the second terminal of resistor 714 and is connected to the second terminal of resistor 722 Conversely if segmented resistor 900 is used to implement resistor 812 of FIG. 8 and if the matched value includes two resistor segments, then the SEL signal selects the second input thereof, the first terminal of resistive segment 912 forms the first terminal of resistor 812, and the output of multiplexer 920 forms the second terminal of resistor 812.

Figure 10:
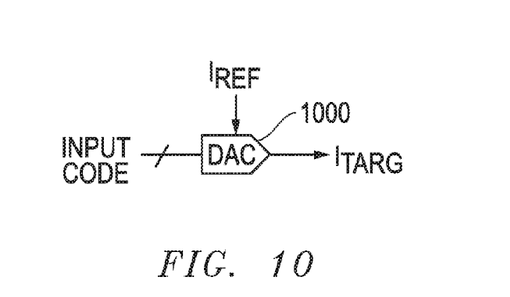
FIG. 10 illustrates in block diagram form a current source suitable for use in the target signal generators of FIGS. 3, 4, and 6-8.

FIG. 10 illustrates in block diagram form a current source 1000 suitable for use in the target signal generators of FIGS. 3, 4, and 6-8. Current source 1000 is implemented using a current digital-to-analog converter (DAC) that has an input for receiving a multi-bit input code, a reference input for receiving a reference current, and an output for providing current $I_{TARG}$. By being programmable, current source 1000 can be used in a current sense element with the configurations such as those of FIGS. 2, 3, and 6-8 but adapted for different application environments by providing a range of target currents.

Figure 11:
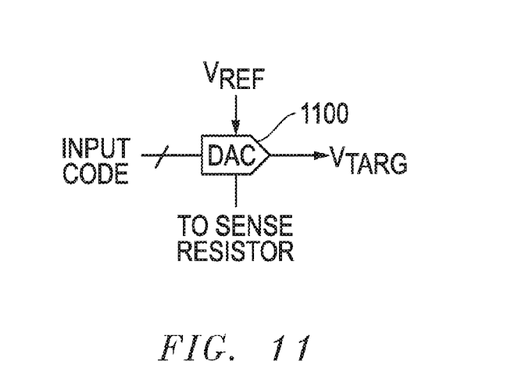
FIG. 11 illustrates in block diagram form a voltage source suitable for use in the target signal generators of FIGS. 7 and 8.

FIG. 11 illustrates in block diagram form a voltage source 1100 suitable for use in the target signal generators of FIGS. 7 and 8. Voltage source 1100 is implemented using a voltage DAC that has an input for receiving a multi-bit input code, a reference input for receiving a reference voltage, a signal input coupled to the sense resistor, and an output for providing voltage $V_{TARG}$. By being programmable, voltage source 1100 can be used in a current sense element with the configurations of FIGS. 7 and 8 but adapted for different application environments providing for a range of target voltages.

Figure 12:
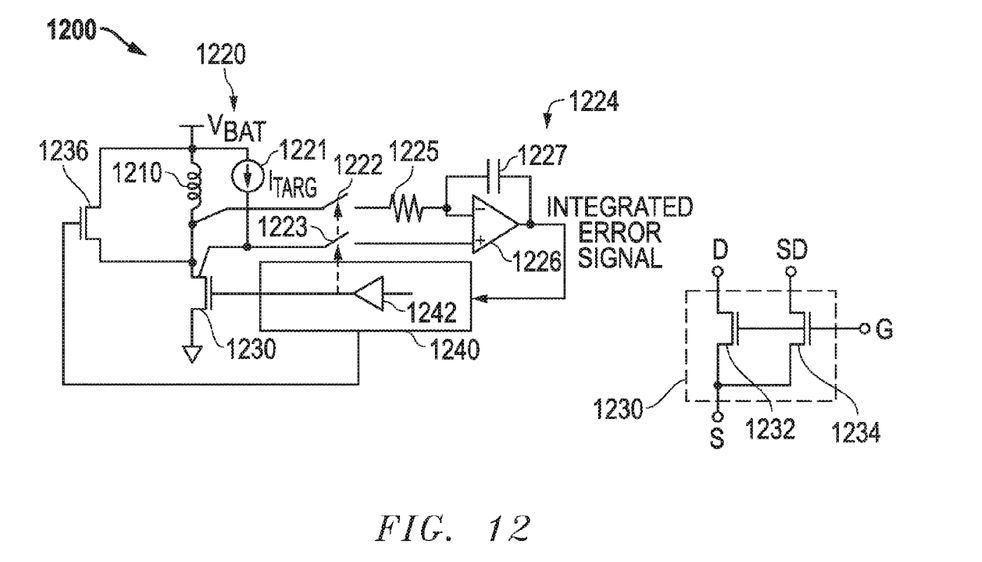
FIG. 12 illustrates in partial block diagram and partial schematic form a current regulated circuit according to a further embodiment of the current regulated circuit of FIG. 2.

FIG. 12 illustrates in partial block diagram and partial schematic form a current regulated circuit 1200 according to a further embodiment of current regulated circuit 200 of FIG. 2. Current regulated circuit 1200 includes generally a current conducting element in the form of a solenoid 1210, a target and error signal generator 1220, a sense transistor 1230, a transistor 1236, and a control circuit 1240. Solenoid 1210 has a first terminal for receiving $V_{BAT}$, and a second terminal. Current sense portion 1220 includes a current source 1221, switches 1222 and 1223, and a subtractor 1224. Current source 1221 has a first terminal connected to the $V_{BAT}$ terminal, and a second terminal, and conducts current $I_{TARG}$. Switch 1222 has a first terminal connected to the second terminal of solenoid 1210, a second terminal, and a control terminal. Switch 1223 has a first terminal connected to the sense drain terminal of transistor 1220, a second terminal, and a control terminal. Subtractor 1224 has a first input connected to the second terminal of switch 1222, a second terminal connected to the second terminal of switch 1223, and an output terminal for providing the INTEGRATED ERROR SIGNAL. Subtractor 1224 includes an optional resistor 1225, an amplifier 1226, and a capacitor 1227. Resistor 1225 has a first terminal connected to the second terminal of switch 1222, and a second terminal. Amplifier 1226 has a non-inverting input connected to the second terminal of resistor 1225, an inverting input connected to the second terminal of switch 1223, and an output for providing the INTEGRATED ERROR SIGNAL. Capacitor 1227 has a first terminal connected to the output terminal of amplifier 1226, and a second terminal connected to the non-inverting input of amplifier 1226.

Sense transistor 1230 has a drain connected to the second terminal of solenoid 1210 and to the first terminal of switch 1223, a sense drain connected to the second terminal of current source 1221 and to the first terminal of switch 1223, a gate, and a source connected to ground. Sense transistor 1230 is a composite N-channel MOS power transistor having a drain terminal, a sense drain terminal, a gate, and a source. Sense transistor 1230 is formed using a current conduction element 1232 and a drain sense element 1234. Current conduction element 1232 has a drain forming the drain terminal of sense transistor 1230, a gate connected to the gate terminal of sense transistor 1230, and a source connected to the source terminal of sense transistor 1230. Drain sense element 1234 has a drain forming the sense drain terminal of sense transistor 1230, a gate connected to the gate terminal of sense transistor 1230, and a source connected to the source terminal of sense transistor 1230. Transistor 1236 is a P-channel MOS transistor having a source connected to the $V_{BAT}$ terminal, a gate, and a drain connected to the second terminal of solenoid 410.

Control circuit 1240 has an input connected to the output of amplifier 1226, a first output connected to the gate of transistor 1230 and to the control terminals of switches 1222 and 1223, and a second output connected to the gate of transistor 1236. As shown in FIG. 12, control circuit 1240 includes a buffer 1242 having an output forming the first output of control circuit 1240.

Current regulated circuit 1200 uses sense transistor 1230 in a manner similar to current regulated circuit 400 of FIG. 4, but uses a different target and error signal generator 1220. Current sensing circuit 1220 includes subtractor 1224 as an integrating subtractor that, through switches 1222 and 1223, is synchronized to the switching activity. Thus when sense transistor 1230 is conductive, switches 1222 and 1223 are closed, and subtractor 1224 integrates the difference between the MEASURED SIGNAL and the TARGET SIGNAL. When sense transistor 1230 is non-conductive, switches 1222 and 1223 are open, and subtractor 1224 retains the integrated difference between the MEASURED SIGNAL and the TARGET SIGNAL.

Figure 13:
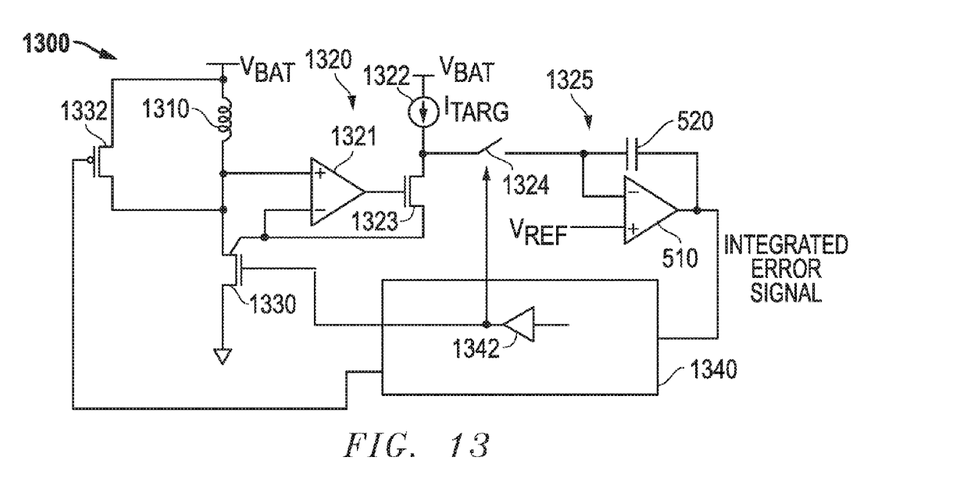
FIG. 13 illustrates in partial block diagram and partial schematic form a current regulated circuit according to a still further embodiment of the current regulated circuit of FIG. 2.

FIG. 13 illustrates in partial block diagram and partial schematic form a current regulated circuit 1300 according to a still further embodiment of the current regulated circuit of FIG. 2. Current regulated circuit 1300 includes generally a current conducting element in the form of a solenoid 1310, a target and error signal generator 1320, a sense transistor 1330, a transistor 1332, and a control circuit 1340. Solenoid 1310 has a first terminal for receiving $V_{BAT}$, and a second terminal. Target and error signal generator 1320 includes an amplifier 1321, a current source 1322, a transistor 1323, a switch 1324, and an integrator 1325. Amplifier 1321 has a non-inverting input connected to the second input of solenoid 1310, an inverting input, and an output. Current source 1322 has a first terminal connected to the $V_{BAT}$ terminal, and a second terminal, and conducts current $I_{TARG}$. Transistor 1323 has a drain connected to the second terminal of current source 1322, a gate connected to the output of amplifier 1321, and a source connected to the inverting input of amplifier 1321. Switch 1324 has a first terminal connected to the second terminal of current source 1322, a second terminal, and a control terminal. Integrator 1325 has an input terminal connected to the second terminal of switch 1324, and an output terminal for providing the INTEGRATED ERROR SIGNAL.

Sense transistor 1330 has a drain connected to the second terminal of solenoid 1310, a sense drain connected to the inverting input of amplifier 1321 and to the source of transistor 1323, a gate, and a source connected to ground. Sense transistor 1330 is a composite N-channel MOS power transistor constructed as described with respect to FIG. 4 above. Transistor 1332 is a P-channel MOS transistor having a source connected to the $V_{BAT}$ terminal, a gate, and a drain connected to the second terminal of solenoid 1310.

Control circuit 1340 has an input connected to the output of integrator 1325, a first output connected to the gate of transistor 1330 and to the control terminal of switches 1324, and a second output connected to the gate of transistor 1332. As shown in FIG. 12, control circuit 1340 includes a buffer 1342 having an output forming the first output of control circuit 1340.

Current regulated circuit 1300 provides an error signal as a differential current $\Delta I$ using a sense transistor 1330, integrates the differential current during the conduction time of solenoid 1310 to provide the INTEGRATED ERROR SIGNAL, and controls the on time of sense transistor 1330 to regulate the current of solenoid 1310 to a desired amount. Thus it is a modification of current regulated circuit 400 of FIG. 4 by using switch 1324 and integrator 1325 to limit the control during conduction times of transistor 1330.

Various modifications to the circuits described above can be made in order to provide a more robust signal path and also to convert from the floating ground domain of the current sensing resistor to the controller domain. These modifications will now be described.

Figure 14:
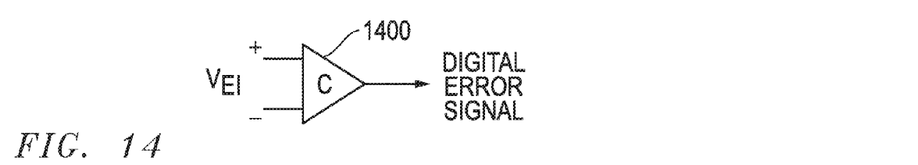
FIG. 14 illustrates in block diagram form a first digital converter circuit that may be used in the current regulated circuit of FIG. 2.

FIG. 14 illustrates in block diagram form a first digital converter circuit 1400 that may be used in current regulated circuit 200 of FIG. 2. Digital converter circuit 1400 is a comparator having a non-inverting input, an inverting input, and an output for providing a single-bit error signal labeled "DIGITAL ERROR SIGNAL", in which a differential integrated error voltage labeled "$V_{EI}$" is sensed between the non-inverting and inverting inputs. In this case, a control circuit such as a DSP can either filter and process the single bit signal, or decimate the sequence of bits over a certain period of time to form a multi-bit digital code and filter and process the multi-bit digital code.

Figure 15:
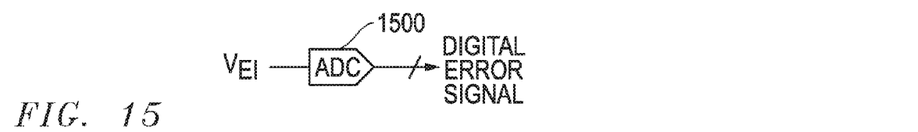
FIG. 15 illustrates in block diagram form a second digital converter circuit that may be used in the current regulated circuit of FIG. 2.

FIG. 15 illustrates in block diagram form a second digital converter circuit 1500 that may be used in current regulated circuit 200 of FIG. 2. Digital converter circuit 1500 is an ADC having an input for receiving an integrated error voltage $V_{EI}$ as a single-ended error signal, and an output for providing a multiple-bit DIGITAL ERROR SIGNAL. In this case single-ended error voltage $V_{EI}$ is a continuous value among a range of values, and digital converter 1500 provides a multiple bit DIGITAL ERROR SIGNAL to represent error voltage $V_{EI}$.

Figure 16:
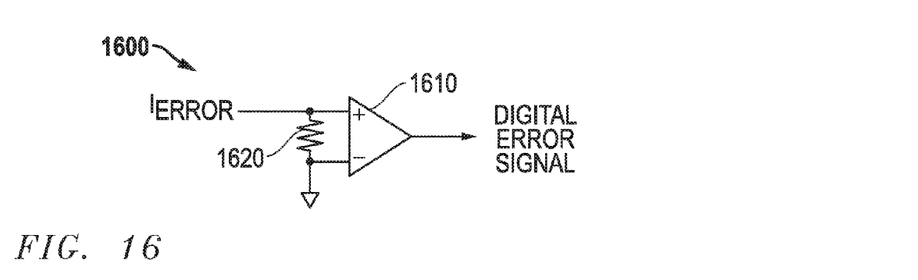
FIG. 16 illustrates in partial block diagram and partial schematic form a third digital converter circuit that may be used in the current regulated circuit of FIG. 2.

FIG. 16 illustrates in partial block diagram and partial schematic form a third digital converter circuit 1600 that may be used in current regulated circuit 200 of FIG. 2. Digital converter circuit 1600 includes a comparator 1610 and a resistor 1620. Comparator 1610 has a non-inverting input connected to a node that receives an error current labeled "$I_{ERROR}$", an inverting input connected to ground, and an output for providing a single-bit DIGITAL ERROR SIGNAL. Resistor 1620 has a first terminal connected to the non-inverting input of comparator 1610, and a second terminal connected to the inverting input of comparator 1610 and to ground (or to any reference voltage). In digital converter circuit 1600, comparator 1610 senses a differential error signal formed by the voltage drop across resistor 1620 when conducting current $I_{ERROR}$. As before, a control circuit such as a DSP can either filter and process the single bit signal, or decimate the sequence of bits over a certain period of time to form a multi-bit digital code and filter and process the multi-bit digital code.

Figure 17:
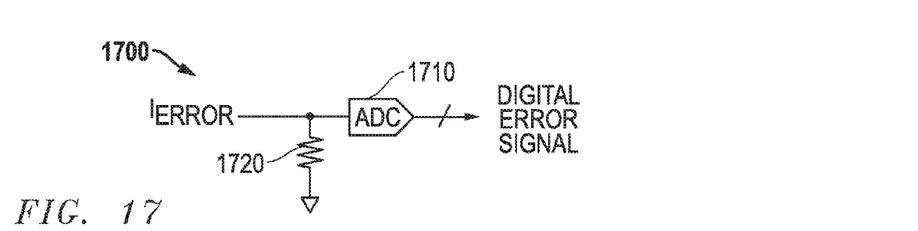
FIG. 17 illustrates in partial block diagram and partial schematic form a fourth digital converter circuit that may be used in the current regulated circuit of FIG. 2.

FIG. 17 illustrates in partial block diagram and partial schematic form a fourth digital converter circuit 1700 that may be used in current regulated circuit 200 of FIG. 2. Digital converter circuit 1700 includes an ADC 1710 and a resistor 1720. ADC 1710 has an input connected to a node that receives I ERROR, and an output for providing a multiple-bit DIGITAL ERROR SIGNAL. Resistor 1720 has a first terminal connected to the node that receives $I_{ERROR}$, and a second terminal connected to ground (or to any reference voltage). In this circuit resistor 1720 converts $I_{ERROR}$ into a voltage, and digital converter 1700 provides a multiple bit DIGITAL ERROR SIGNAL to represent this voltage.

In each of these digital converter circuits, the error signal is level shifted from the floating domain of the sense resistor into the current regulation and measurement domain. These circuits do not require accurate gain when performing the level shifting. Moreover they use either a simple comparator or a low-cost ADC with a few bits, which is sufficient for high accuracy current regulation. Note that the comparators used in digital converter circuit 1400 and 1600 can be used to implement a successive approximation ADC in which the reference voltages are changed to search for the digital code that most accurately represents the input voltage.

Figure 18:
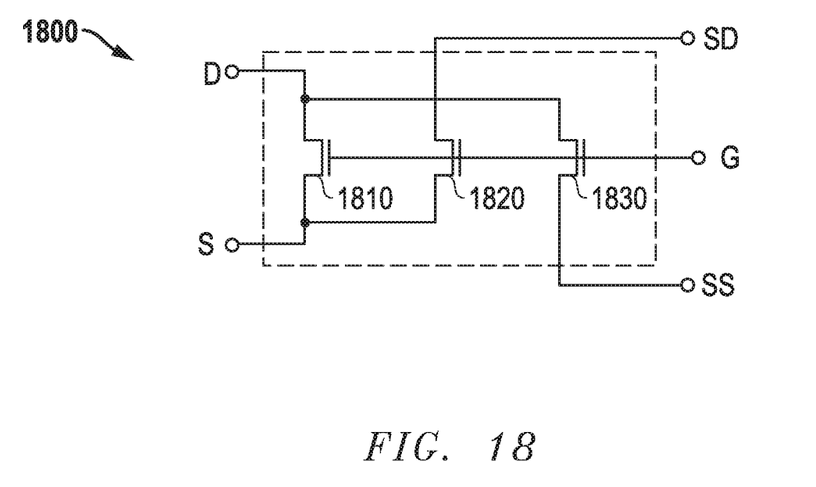
FIG. 18 illustrates in schematic form a sense transistor that can be used in any of the current regulated circuits of FIGS. 4, 6, 12, and 13.

FIG. 18 illustrates in schematic form a sense transistor 1800 that can be used in any of the current regulated circuits of FIGS. 4, 6, 12, and 13. Sense transistor 1800 is similar to the previously described sense transistors except that it additionally has a sense source terminal. Sense transistor 1810 is a composite N-channel MOS power transistor having a drain terminal labeled "D", a sense drain terminal labeled "SD", a gate terminal labeled "G", a source labeled "S", and a sense source labeled "SS". Sense transistor 1800 is formed using a current conduction element 1810, a drain sense element 1820, and a source sense element 1830. Current conduction element 1810 has a drain forming the drain terminal of sense transistor 1800, a gate connected to the gate terminal of sense transistor 1800, and a source connected to the source terminal of sense transistor 1800. Drain sense element 1820 has a drain forming the sense drain terminal of sense transistor 1800, a gate connected to the gate terminal of sense transistor 1800, and a source connected to the source terminal of sense transistor 1800. Source sense element 1830 has a drain connected to drain terminal of sense transistor 1800, a gate connected to the gate terminal of sense transistor 1800, and a source providing the sense source terminal of sense transistor 1800.

When operated in the forward direction, positive current flows from the sense drain to source and the sense source terminal SS is the reference terminal. When operated in the reverse direction, positive current flows from the sense source to source and the sense drain terminal SD is the reference terminal. Sense transistor 1800 allows the bulk connection of each transistor to be isolated from the source and is conveniently implemented using an epitaxial MOS process. Thus sense transistor 1800 provides additional flexibility in floating ground applications such as the solenoid with a sense resistor as described in FIG. 2 and similar FIGs. above.

While particular embodiments have been described, various modifications to these embodiments will be apparent to those skilled in the art. For example, the circuits of FIGS. 2, 3, 4, 12, and 13 show transistors 232, 332, 436, 1236, and 1352 controlled by respective control circuits, but in other embodiments the transistors could be replaced by diodes connected as shown for diode 150 in FIG. 1. Moreover in other embodiments the topologies of the circuits shown in FIGS. 2, 3, 4, 12, and 13 above could be reversed. For example to reverse the topology of current regulated circuit 200, transistor 230 would be connected between $V_{BAT}$ and the first terminal of current sense element 222, and solenoid 210 would be connected between the second terminal of current sense element 222 and ground.

Accordingly, it is intended by the appended claims to cover all modifications of the disclosed embodiments that fall within the scope of the disclosed embodiments.

What is claimed is:

1. A circuit having a current sensor, the current sensor comprising:
    a current sensing element having first and second terminals and adapted to be coupled in a current path whose current is to be sensed;
    a target signal generator for generating a target signal representative of a condition of said current sensing element when said current sensing element conducts a target current; and
    an error signal generator having an output for providing an error signal in response to both a current flowing through said current sensing element and said target signal,
    wherein the circuit comprises a sense transistor having a drain, a sense drain, a gate, and a source, wherein current sensing element comprises a current conduction element coupled between said drain and said source of a sense transistor, and said target signal generator comprises a drain sense element coupled between said sense drain and said source of said sense transistor.

2. The circuit of claim 1, wherein said sense transistor is an epitaxially fabricated metal-oxide-semiconductor (MOS) transistor having a bulk terminal and a source wherein said bulk terminal is isolated from said source.

3. The circuit of claim 1, wherein said error signal generator comprises:
    a difference amplifier having a first input coupled to a first terminal of said current sensing element, a second input for receiving said target signal, and an output; and
    an analog-to-digital converter having an input coupled to said output of said difference amplifier, and an output for providing said error signal as a digital error signal.

4. The circuit of claim 1, wherein the circuit is a current regulated circuit further comprising:
    a current conducting element having a first terminal coupled to a first power supply voltage terminal, and a second terminal coupled to a first terminal of said current sensor;
    a current control element having a first terminal coupled to a second terminal of said current conducting element, a control electrode, and a second current electrode coupled to a second power supply voltage terminal; and
    a control circuit having an input coupled to said output of said error signal generator, and an output for providing a control signal to said control electrode of said current control element, wherein said control circuit changes said control signal to reduce said error signal.

5. The current regulated circuit of claim 4, wherein said control circuit is coupled to said error signal generator through a converter that converts said error signal into a digital error signal.

6. The current regulated circuit of claim 4 wherein said current conducting element comprises a solenoid.

7. A circuit having a current sensor, the current sensor comprising:
   a current sensing element having first and second terminals and adapted to be coupled in a current path whose current is to be sensed;
   a target signal generator for generating a target signal representative of a condition of said current sensing element when said current sensing element conducts a target current; and
   an error signal generator having an output for providing an error signal in response to both a current flowing through said current sensing element and said target signal, wherein:
   said target signal generator generates a target voltage representative of a voltage drop across said current sensing element when said current sensing element conducts said target current and has first terminal coupled to one of said first and second terminals of said current sensing element, a second terminal for receiving a reference voltage, and a third terminal for providing said target signal.

8. The circuit of claim 7, wherein said current sensing element comprises:
   a sense resistor.

9. The circuit of claim 7, wherein said target signal generator comprises:
   a current source having a first terminal for receiving a reference voltage, and a second terminal for providing a target current; and
   a matched resistor having a first terminal coupled to said second terminal of said current source, and a second terminal coupled to a corresponding one of said first and second terminals of said current sensing element, wherein said matched resistor has a resistance that is matched to a resistance of said current sensing element.

10. The circuit of claim 9, wherein said matched resistor comprises:
    a segmented resistor ladder having a plurality of resistive segments coupled in series between said second terminal of said current source and said second terminal of said current sensing element; and
    a multiplexer having inputs coupled to terminals of respective ones of said plurality of resistive segments, an output for providing the said target signal, and a control terminal for receiving a control signal.

11. The circuit of claim 9, wherein said current source comprises:
    a digital-to-analog converter having a first terminal for receiving a reference current, a second terminal for receiving an input code, and an output terminal for providing said target current.

12. The circuit of claim 7, wherein said target signal generator comprises:
    a digital-to-analog converter having a first terminal for receiving a reference voltage, a second terminal for receiving an input code, a third terminal coupled to current sensing element, and an output terminal for providing said target voltage.

13. A circuit having a current sensor, the current sensor comprising:
    a current sensing element having first and second terminals and adapted to be coupled in a current path whose current is to be sensed;
    a target signal generator for generating a target signal representative of a condition of said current sensing element when said current sensing element conducts a target current; and
    an error signal generator having an output for providing an error signal in response to both a current flowing through said current sensing element and said target signal, wherein said error signal generator comprises:
    a difference amplifier having a first input coupled to a first terminal of said current sensing element, a second input for receiving said target signal, and an output; and
    a transistor having a first current electrode coupled to one of said first and second inputs of said difference amplifier, a control electrode coupled to said output of said difference amplifier, and an output for providing said error signal as an error current.

14. A current regulated circuit comprising:
    a current conducting element;
    a current sensor; and
    a current control element coupled in series with said current conducting element and said current sensor and conductive in response to a control signal,
    wherein said current sensor comprises:
       a current sensing element coupled in series between said current conducting element and said current control element;
       a subtractor for providing an error signal representative of a difference between a current conducted by said current sensing element and a target current when said current control element is conductive; and
       an integrator for forming an integrated error signal by integrating said error signal,
    wherein:
       said current control element comprises a current conduction element of a sense transistor; and
       said current sensing element comprises a drain sense element of said sense transistor.

15. The current regulated circuit of claim 14 further comprising:
    a control circuit having an input for receiving said integrated error signal, and an output for providing said control signal.

16. The current regulated circuit of claim 14, wherein said subtractor comprises:
    a target current source having a first terminal coupled to a voltage reference terminal, and a second terminal coupled to said drain sense element of said sense transistor;
    a first switch having a first terminal coupled to said current conduction element of said sense transistor, a second terminal for providing a first component of said error signal, and a control terminal for receiving said control signal; and
    a second switch having a first terminal coupled to said drain sense element of said sense transistor, a second terminal for providing a second component of said error signal, and a control terminal for receiving said control signal.

17. The current regulated circuit of claim 14, wherein said subtractor comprises:
    an amplifier having a first input coupled to said current conduction element of said sense transistor, a second input coupled to said drain sense element of said sense transistor, and an output;
    a target current source having a first terminal coupled to a voltage reference terminal, and a second terminal; and
    a transistor having a first current electrode coupled to said second terminal of said target current source, a control electrode coupled to said output of said amplifier, and a second current electrode coupled to said drain sense element of said sense transistor; and a switch having a first terminal coupled to said second terminal of said target current source, a second terminal for providing said error signal, and a control terminal for receiving said control signal.

18. A method comprising:

coupling a current sensing element in a current conduction path of a current regulated circuit, wherein said coupling said current sensing element in said current conduction path of said current regulated circuit comprises coupling a sense resistor in said current conduction path of said current regulated circuit;

developing a sensed signal from a first terminal of said current sensing element;

developing a target signal in response to a characteristic of a circuit element matched to said current sensing element from a second terminal of said current sensing element;

forming an error signal in response to a difference between said sensed signal and said target signal; and regulating a current flow through said current conduction path in response to said error signal.

19. The method of claim 18, wherein said coupling said current sensing element in said current conduction path of said current regulated circuit comprises coupling a sense transistor in said current conduction path of said current regulated circuit.

20. The method of claim 19, wherein:

coupling said sense transistor in said current conduction path of said current regulated circuit comprises coupling a current conduction element of said sense transistor in said current conduction path of said current regulated circuit; and developing said target signal in response to said characteristic of said circuit element comprises developing said target signal in response to said characteristic of a drain sense element of said sense transistor.

* * * * *